United States Patent
Kondo et al.

[11] Patent Number: 5,876,861
[45] Date of Patent: *Mar. 2, 1999

[54] SPUTTER-DEPOSITED NICKEL LAYER

[75] Inventors: Ichiharu Kondo, Nagoya; Takao Yoneyama, Anpachi-gun; Masami Yamaoka, Anjo; Osamu Takenaka, Kariya, all of Japan

[73] Assignee: Nippondenso Company, Ltd., Kariya, Japan

[*] Notice: This patent issued on a continued prosecution application filed under 37 CFR 1.53(d), and is subject to the twenty year patent term provisions of 35 U.S.C. 154(a)(2).

The term of this patent shall not extend beyond the expiration date of Pat. No. 5,614,291.

[21] Appl. No.: 650,437
[22] Filed: May 20, 1996

Related U.S. Application Data

[62] Division of Ser. No. 344,684, Nov. 17, 1994, abandoned, which is a continuation of Ser. No. 754,266, Aug. 29, 1991, abandoned, which is a continuation of Ser. No. 406,239, Sep. 12, 1989, abandoned.

[30] Foreign Application Priority Data

Sep. 15, 1988 [JP] Japan ................................. 63-231653
Jul. 14, 1989 [JP] Japan ................................. 1-183502

[51] Int. Cl.⁶ ..................... B32B 15/04; C23C 14/14; C23C 14/16
[52] U.S. Cl. .............. 428/641; 204/192.15; 428/680; 428/672; 428/332
[58] Field of Search ............... 439/887; 204/192.1, 204/192.15, 192.17; 200/262, 267, 268, 269; 427/123, 250, 544, 680, 667, 672; 428/672, 209, 620, 641, 332, 544, 680, 667

[56] References Cited

U.S. PATENT DOCUMENTS

| | | |
|---|---|---|
| 3,461,054 | 8/1969 | Vratny ..................................... 204/192 |
| 3,516,915 | 6/1970 | Mayer et al. ............................ 204/192 |
| 3,945,903 | 3/1976 | Svendor et al. ........................ 204/192 |
| 3,982,908 | 9/1976 | Arnold .................................... 428/641 |
| 4,513,905 | 4/1985 | Nowicki et al. ........................ 228/123 |
| 4,588,343 | 5/1986 | Garrett .................................... 414/221 |
| 4,610,932 | 9/1986 | Haynes et al. .......................... 428/611 |
| 4,816,124 | 3/1989 | Mahabe et al. ..................... 204/192.14 |
| 4,994,880 | 2/1991 | Kato et al. ................................ 357/34 |
| 5,361,971 | 11/1994 | Williams et al. ....................... 228/193 |
| 5,614,291 | 3/1997 | Kondo ................................... 428/209 |

FOREIGN PATENT DOCUMENTS

| | | |
|---|---|---|
| 330122 | 8/1989 | European Pat. Off. . |
| 56-142633 | 4/1980 | Japan . |
| 63-290268 | 11/1988 | Japan . |

OTHER PUBLICATIONS

Thornton et al., "Internal Stresses in Ti, Ni, Mo, etc." J. Vac. Sci. Technol. vol. 14, Jan. 1977, pp. 164–168.

(List continued on next page.)

*Primary Examiner*—John J. Zimmerman
*Assistant Examiner*—Michael LaVilla
*Attorney, Agent, or Firm*—Pillsbury Madison & Sutro LLP

[57] ABSTRACT

Disclosed is a nickel layer formed on a substrate by sputtering, in which nickel layer a percent ratio of an X-ray diffraction peak intensity of the (200) plane of the nickel layer to that of the (111) plane of the nickel layer is not less than 10%. This nickel layer has a reduced stress, and therefore, lessens a bending of a substrate. The nickel layer is formed by a process for sputtering nickel on a substrate, comprising supplying an argon gas into a vacuum chamber, adjusting a pressure of the argon gas in the vacuum chamber to a predetermined value, ionizing the argon gas, bombarding a target containing nickel with the ionized argon gas, to sputter nickel atoms, and depositing the sputtered nickel atoms onto the substrate, wherein the predetermined pressure of the argon gas is not lower than 12 mTorr.

11 Claims, 7 Drawing Sheets

OTHER PUBLICATIONS

T. Takeuchi et al, "Stress in Thin Tantalum Films Deposited Magnetron Sputtering" pp. 612–618 (Jul., 1987).

T. Yoneyama et al, "Thin Film Structure and Adhesion of Sputtered Thin Layers on Silicon", Thin Solid Films, 193/194(1990) pp. 1056–1064 (No Month).

S. Shinzato et al, Proc. 7th ICVW, 1982, Tokyo, Japan, pp. 172–179 (No Month).

D.W. Hoffman et al, Thin Solid Films, 45 (1977) pp. 367–396 (No Month).

D.W. Hoffman et al, Journal Vacuum Science Technology, 20 (3) Mar. 1982, pp. 355–358.

John A. Thornton et al, "Internal Stresses in Titanium, Nickel, Molybdenum and Tantalum Films Deposited by Cylindrical Magnetron Sputtering", Journal of Vacuum Science and Technology, Jan./Feb. 1977, pp. 164–168.

B. Navinsek, 637 "Stainless–Steel, Nickel and Brass Protective Films Produced by Cathode Sputtering", Thin Solid Films, Nov. 1972, pp. 367–372.

Y. K. Chao et al, "Porosity in Thin Ni/Au Metallization Layers", Journal of Vacuum Science and Technology, May/Jun. 1987, pp. 337–372.

D. L. Packwood et al. "Contact Metallization for Producing Stable Bipolar Microwave Transistors", Journal of Vacuum Science and Technology, May/Jun. 1985, pp. 799–802.

P.V. Plunkett et al, "Stresses in Sputter Deposited Nickel and Copper Oxide Thin Films", Thin Solid Film, Nov. 1979, pp. 121–128.

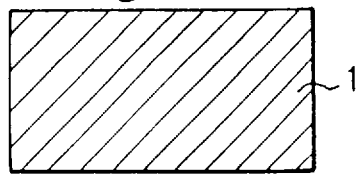
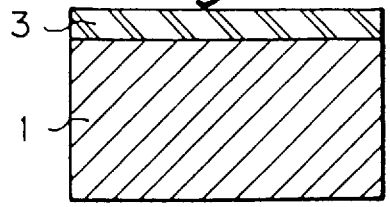
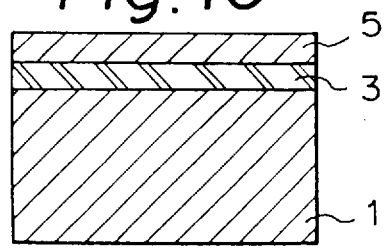
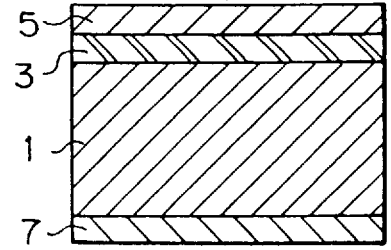
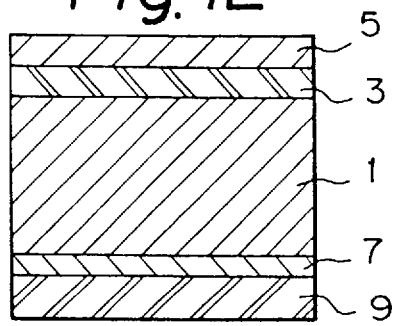
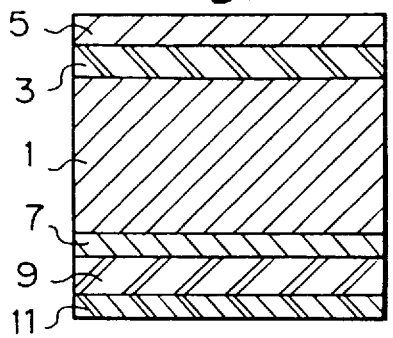
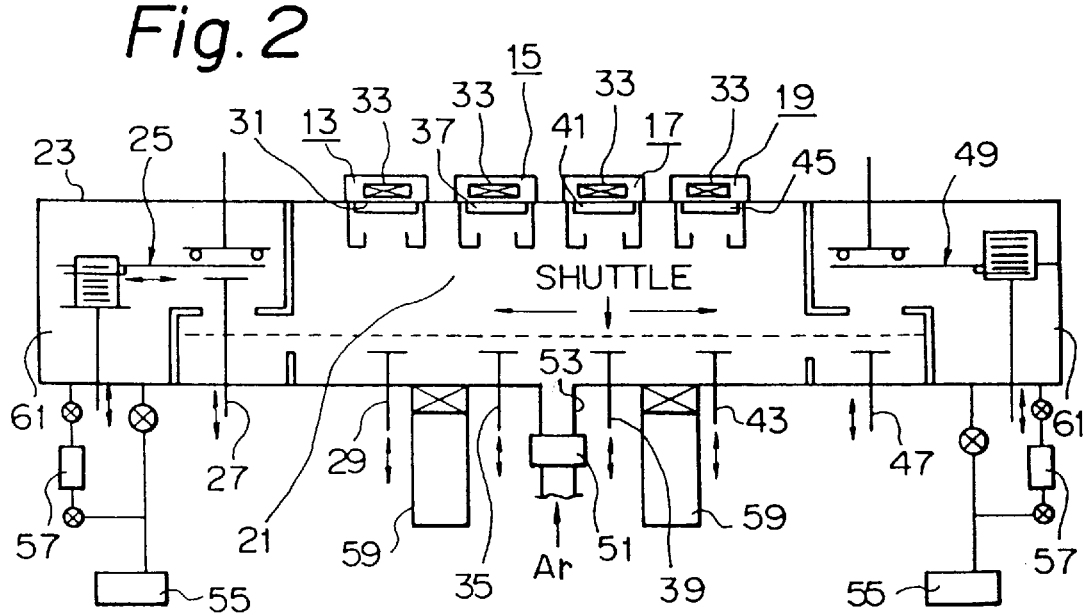

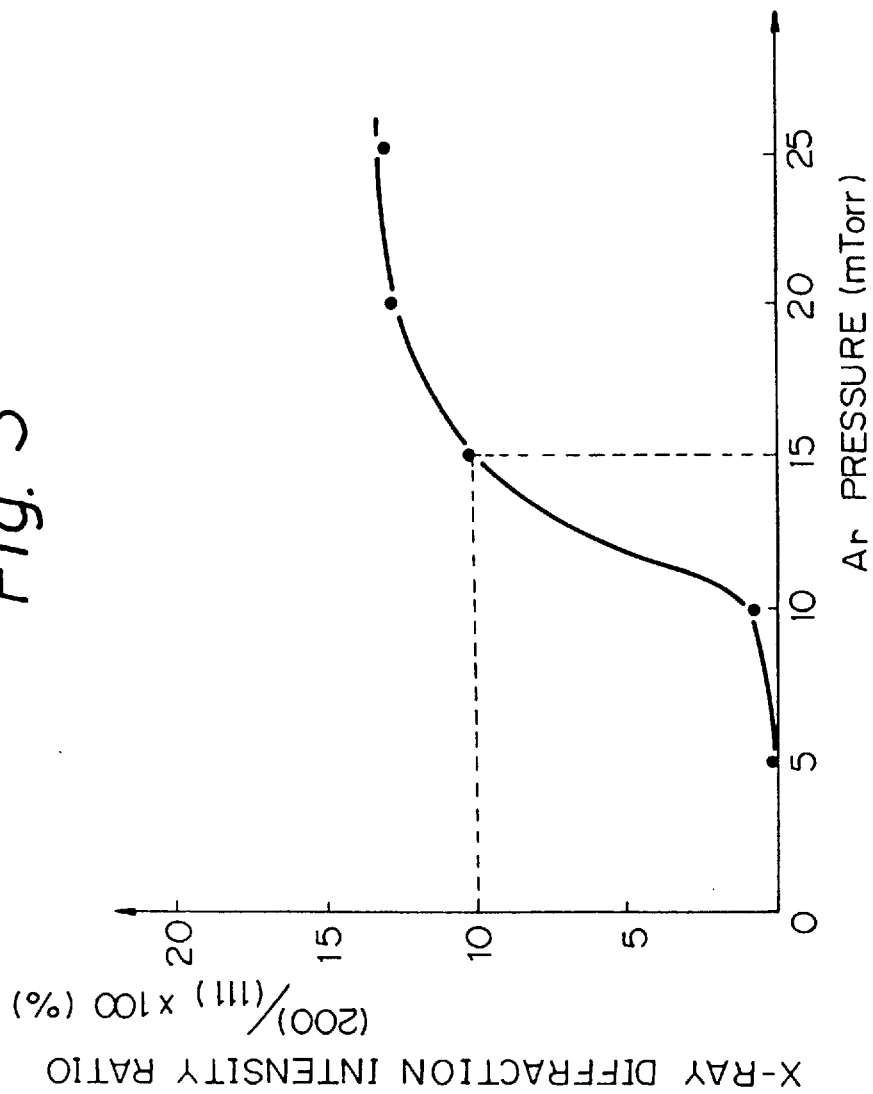

LOW Ar PRESSURE
(HIGH STRESS)

HIGH Ar PRESSURE
(LOW STRESS)

SPUTTER-DEPOSITED NICKEL LAYER

This is a division of application Ser. No. 8 /344,684, filed Nov. 17, 1994 now abandoned, which is a Cont. of Ser. No. 07/754,266 filed Aug. 29, 1991, now abandoned; which is a Cont. of Ser. No. 07/406,239 filed Sep. 12, 1989, now abandoned.

BACKGROUND OF THE INVENTION

1. Field of the Invention

The present invention relates to a nickel layer deposited by sputtering and having a reduced stress, and a process for depositing such a sputtered nickel layer.

2. Description of the Related Art

A consecutive sputtering of titanium, nickel and gold layers onto a semiconductor substrate or wafer to form a laminated metal electrode, in which an argon pressure used during the sputtering is usually 2 to 10 mTorr, is known. This pressure range is adopted because, at a higher argon pressure, the electric resistivity of the deposited layer is high and the load on a vacuum pump becomes higher as the argon pressure is increased.

Nevertheless, in the conventional sputtering, a high stress occurs in particularly the deposited nickel layer, thereby bending the semiconductor wafer and reducing the adhesive strength of the deposited layers. Particularly, the bending of a wafer is a severe problem in an automatic manufacturing line, and wafers having a bend larger than 350 $\mu$m cannot be transferred in the automatic manufacturing line and thus must be manually transferred.

SUMMARY OF THE INVENTION

The object of the present invention, therefore, is to reduce the stress in the deposited nickel layer and to provide a process for forming such a layer by sputtering.

Thus, according to the present invention, there is provided a nickel layer formed on a substrate, in which a percent ratio of an X-ray diffraction peak intensity of the (200) plane of the nickel layer to that of the (111) plane of the nickel layer is not less than 10%.

A preferred embodiment of the present invention is a power element comprising a silicon substrate having a top surface and a rear surface, a doped region formed adjacent to the top surface of the substrate, a first electrode formed on the top surface of the substrate and electrically connected to the doped region, and a second electrode formed on the rear surface of the substrate, the second electrode including a nickel layer in which a percent ratio of an X-ray diffraction peak intensity of the (200) plane of the nickel layer to that of the (111) plane of the nickel layer is not less than 10%. The second electrode of the power element preferably comprises a titanium layer deposited on the silicon substrate, a nickel layer deposited on the titanium layer, and a gold layer deposited on the nickel layer.

The present invention was created by a finding of the inventors that the stress in the deposited nickel layer can be reduced by increasing the pressure of the argon gas during the sputtering.

Thus, according to the present invention, there is also provided a process for sputtering nickel on a substrate, comprising supplying an argon gas into a vacuum chamber, adjusting a pressure of the argon gas in the vacuum chamber to a predetermined value, ionizing the argon gas, bombarding a target containing nickel with the ionized argon gas to sputter nickel atoms, and depositing the sputtered nickel atoms onto the substrate, wherein said predetermined pressure of the argon gas is not lower than 12 mTorr, preferably not lower than 15 mTorr.

Preferably, the temperature of the substrate during the sputtering is 100° to 250° C.

During the depositing of a nickel layer onto a titanium layer formed on a substrate, the pressure of the argon gas is preferably not higher than 25 mTorr.

BRIEF DESCRIPTION OF THE DRAWINGS

FIGS. 1A to 1F are sectional views illustrating the steps of forming a laminated metal electrode according to the present invention;

FIG. 2 is a sectional view of a sputtering device used for forming the laminated metal electrode;

FIG. 3 shows the X-ray diffraction peak ratio $I_{(200)}/I_{(111)}$ ×100 of a nickel layer in relation to the argon pressure;

DESCRIPTION OF THE PREFERRED EMBODIMENTS

Figure 4:
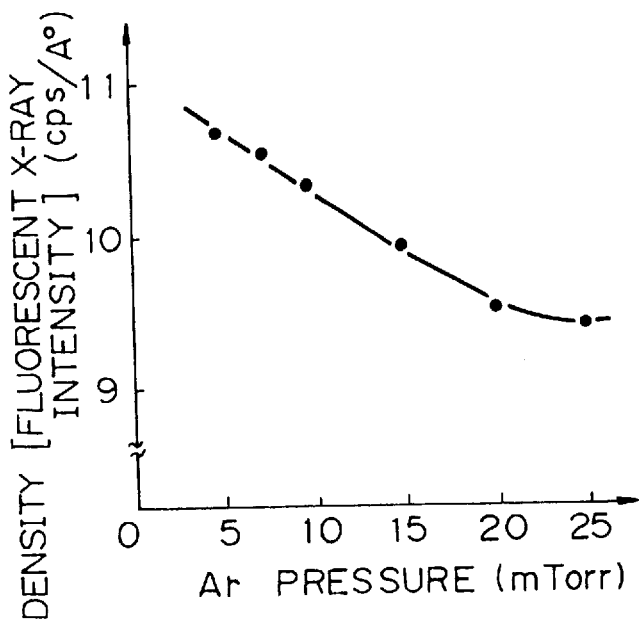
FIG. 4 shows the density of a nickel layer in relation to the argon pressure.

The present invention will be described with reference to the drawings.

A sputtering device as shown in FIG. 1 was used for carrying out the following examples. The device was a DC parallel plane-type magnetron sputtering unit XM-8, manufactured by Varian. During the sputtering, the temperature of the substrate was kept at about 180° C. and the pressure of the argon gas 21 supplied to the chamber 23 was adjusted to 20 mTorr.

FIGS. 1A to 1F show the steps of forming a laminated metal electrode according to an Example of the present invention. In these FIGS. 1 denotes a silicon (Si) substrate having a diameter of 3 inches and a thickness of 230 $\mu$m, in which a base region and an emitter region, etc. of a power bipolar transistor are formed (not shown) and on which an aluminum (Al) wiring layer 3 is then formed in a predetermined pattern, as shown in FIG. 1B, and a silicon nitride ($Si_3N_4$) layer 5 is then formed on the Al wiring layer 3, as shown in FIG. 1C.

After the elements are formed on the top surface of the substrate 1, a metal electrode for a collector electrode is then formed on the rear surface of the substrate 1 by the sputtering unit shown in FIG. 2. In FIG. 2, a carrying-in table 27 receives a wafer from a transport 25 and then descends to pass the wafer to a shuttle (not shown). The shuttle moves along the broken line in FIG. 2 and transfers the wafer first to a process table 29. In a station 13, a radio frequency power is connected to the process table 29 at a lower electric potential, and to a capture 31 at a higher electric potential, specifically ground level, and a sputtering is carried out at a power of 60 W for 180 seconds, whereby ionized argon (Ar$^+$) bombards and etches the rear surface of the substrate 1 at a thickness of about 18 nm. The capture 31 is used to collect contaminants (native oxide, etc.) at the surface of the Si. In FIG. 2, 33 denotes a magnet for confining the discharge.

The shuttle then transfers the wafer to a station 15 and places the wafer on a process table 35. In the station 15, a DC power is connected to the process table 35 at a higher electric potential, specifically ground level, and to a titanium (Ti)-containing target 37 at a lower electric potential, and a sputtering is carried out at a power of 2 kW for 75 seconds, whereby ionized argon (Ar$^+$) bombards the target 37, and Ti atoms sputtered from the target 37 are deposited onto the Si substrate 1 to form a Ti layer 7 having a thickness of about 250 nm, as shown in FIG. 1D.

Then the shuttle transfers the wafer to a station 17 and place the wafer on a process table 39. In the station 17, a DC power is connected to the process table 39 at a higher electric potential, specifically ground level, and to a nickel (Ni)-containing target 41 at a lower electric potential, and a sputtering is carried out at a power of 1 kW for 240 seconds, whereby ionized argon (Ar$^+$) bombards the target 41, and Ni atoms sputtered from the target 41 are deposited onto the Ti layer 7 to form a Ni layer 9 having a thickness of about 600 nm, as shown in FIG. 1E.

The shuttle then transfers the wafer to a station 19 and places the wafer on a process table 43. In the station 19, a DC power is connected to the process table 43 at a higher electric potential, specifically ground level, and to a gold (Au)-containing target 45 at a lower electric potential, and a sputtering is carried out at a power of 0.5 kW for 12 seconds, whereby ionized argon (Ar$^+$) bombards the target 45, and Au atoms sputtered from the target 45, are deposited onto the Ni layer 9 to form an Au layer 11 having a thickness of about 50 nm, as shown in FIG. 1F.

The wafer with the thus formed metal laminate electrode is transferred to a taking-out lock table 47 which then ascends to pass the wafer to a transport 49.

The Ar gas is introduced to a chamber 23 from a gas inlet 53 after passing through a mass flow meter 51. The pressure of the Ar gas is determined by the feed rate of the Ar gas adjusted by the mass flow meter 51 and the degree of evacuation of the chamber 23 by vacuum pumps. The vacuum pumps include a rotary pump 55, a turbo pump 57 and a cryo pump 59. The rotary pump 55 conducts a rough evacuation, the turbo pump 57 conducts an intermediate evacuation and an evacuation of a lock chamber 61, and the cryo pump 59 conducts a determining evacuation.

In the above process, the deposited Ni layer 9 contains a very small amount of Ar gas in the layer 9, since the sputtering on the Ni layer is carried out in the Ar atmosphere.

The detailed structure of the bipolar transistor may be found, for example, in U.S. Ser. No. 114,287 filed on Oct. 29, 1987 (corresponding to Japanese Unexamined Patent Publication (Kokai) No. 63-114,259).

Figure 8:
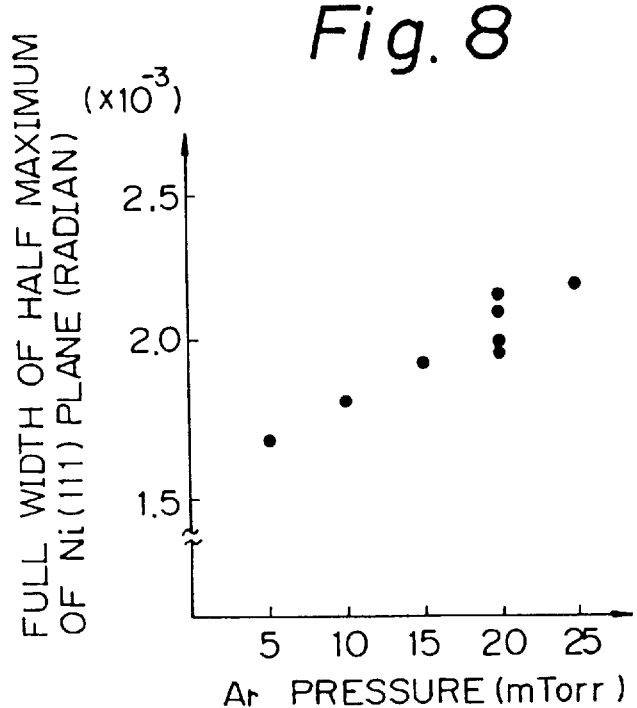
FIG. 8 shows the full width of half maximum of the (111) plane of the Ni layer in relation to the argon pressure.
Figure 9A:
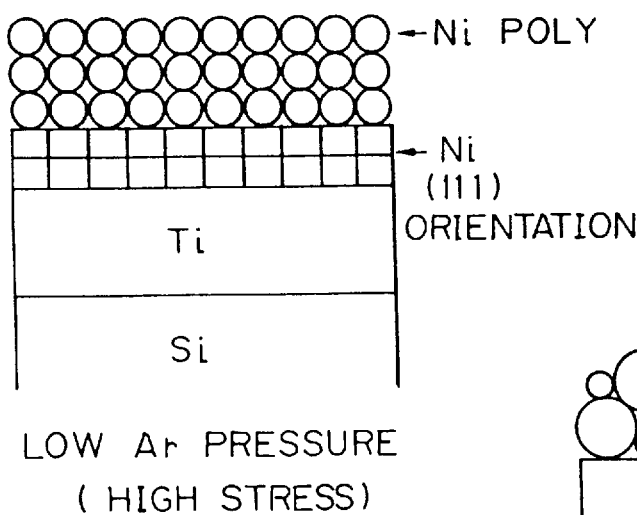
FIGS. 9A and 9B schematically illustrate the structures of deposited nickel layers on a substrate at low and high argon pressures.
Figure 9B:
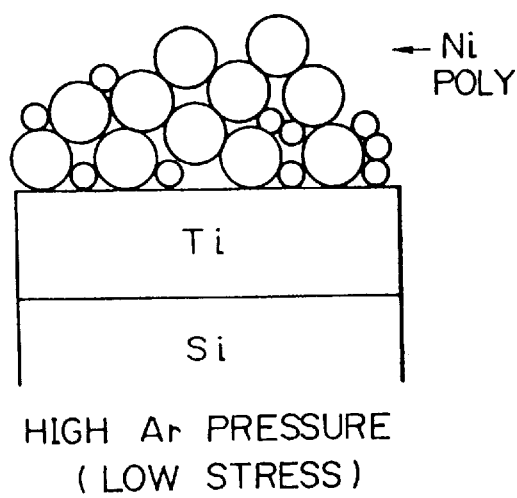

In the above example, the pressure of the argon gas was 20 mTorr. FIGS. 3 to 8 show results when the argon gas pressure was varied. FIG. 3 shows the X-ray diffraction intensity of the Ni layer when the pressure of the argon gas was varied. The abscissa denotes the argon gas pressure and the ordinate denotes the ratio of the X-ray diffraction intensities of the peaks of the (200) plane to the (111) plane of the Ni layer in percent, i.e., $I_{(200)}/I_{(111)} \times 100$. The measurement was carried out by an X-ray diffraction unit RAD$_{II}$C, manufactured by Rigaku, under the conditions of 40 kV, 40 mA and room temperature. It is seen from FIG. 3 that the rate of the (200) plane to the (111) plane is increased with the increase of the pressure of the argon gas. The reasons therefor are considered to be as follows. Nickel is a face-centered cubic lattice metal, and therefore, tends to deposit on the substrate in a manner such that the densest plane (111) of the crystal becomes parallel to the top surface of the substrate. When the pressure of the argon gas is increased, however, the possibility of a collision of the Ni particles with the argon moleculars in the atmosphere is increased, which collision lowers the energy of the Ni particles so that a dispersion of the Ni grain size of the Ni layer and a dispersion of the orientation in the Ni layer occur. FIGS. 9A and 9B show models of such results. FIG. 9A shows the case in which the Ar pressure is low, the (111) planes of Ni appear in parallel to the surface of Ti, and the polycrystalline Ni grain size is uniform. FIG. 9B shows the case in which the Ar pressure is high, the (111) planes of Ni are decreased, and the polycrystalline Ni grain size becomes nonuniform.

The above is supported by the results shown in FIG. 4. FIG. 4 shows the relationships between the argon gas pressure and the density of the deposited Ni layer. The abscissa denotes the argon gas pressure and the ordinate denotes the density of the Ni layer calculated from the fluorescence X-ray intensity. With the increase of the Ar gas pressure, the polycrystalline Ni grain size becomes nonuniform, and therefore, the gaps between the Ni grains become large, so that the density of the Ni layer is lowered. FIG. 8 shows the relationships between the Ar gas pressure and the full width of half maximum of the (111) plane of the Ni layer. This also indicates that, with an increase of the Ar gas pressure, the Ni grain size of the Ni layer becomes dispersed, and therefore, the full width of half maximum becomes larger.

Figure 5:
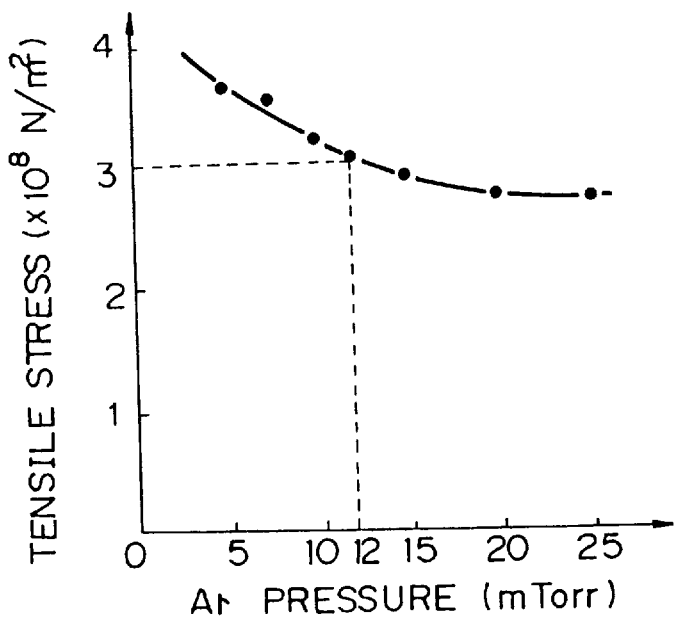
FIG. 5 shows the layer stress of a nickel layer in relation to the argon pressure.

FIG. 5 shows the tensile stress of the Ni layer in relation to the Ar gas pressure and indicates that the stress of the Ni layer is reduced by the increase of the Ar gas pressure.

Figure 6:
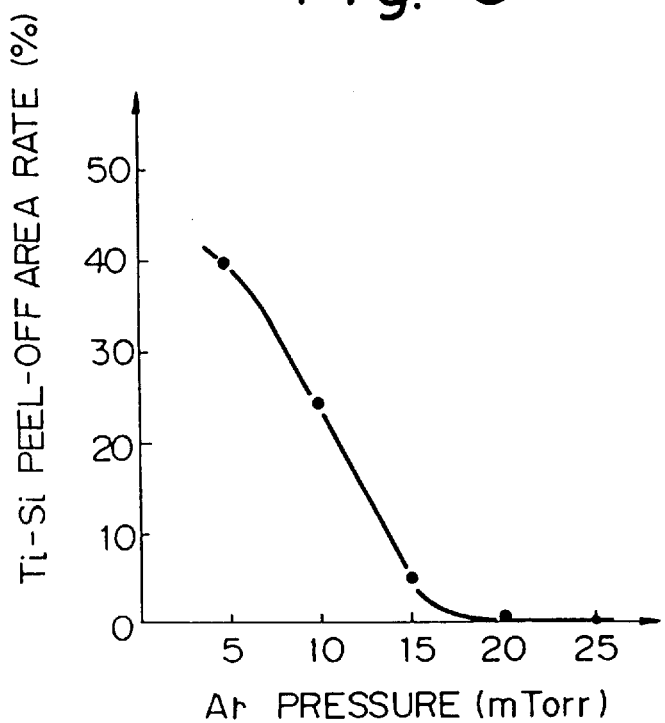
FIG. 6 shows the rate of area of Ti—Si peel-off in relation to the argon pressure.

FIG. 6 shows the Ti—Si peel-off area rate in relation to the Ar gas pressure. The Ti—Si peel-off area rate means that the rate of the area where the peel-off occurs between Ti and Si to the whole area of adhesion between Ti and Si, when the metal layer including the Ti layer and the other metal layers superimposed thereon was peeled from the Si. FIG. 6 also indicates that the rate of the area where the peel-off occurs between Ti and Si is reduced when the Ar gas pressure is increased.

Figure 7:
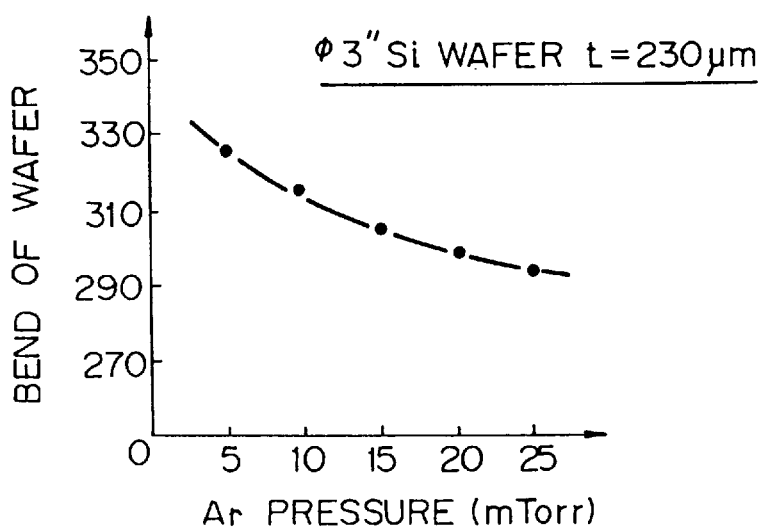
FIG. 7 shows the bend of a wafer in relation to the argon pressure.

FIG. 7 shows the bend of the wafer in relation to the Ar gas pressure and indicates that the bend of the wafer is lessened with the increased of the Ar gas pressure. This is because, due to the increase of the Ar gas pressure, the density of the Ni layer is lowered, and therefore, the stress of the Ni layer is reduced. At a conventional Ar gas pressure of around 5 mTorr, the bend of the wafer is sometimes over the limit for allowing the manufacture in an automatic line of a thickness of 350 $\mu$m, but by increasing the Ar pressure, the possibility of bend of the wafer over the limit is reduced.

Figure 10:
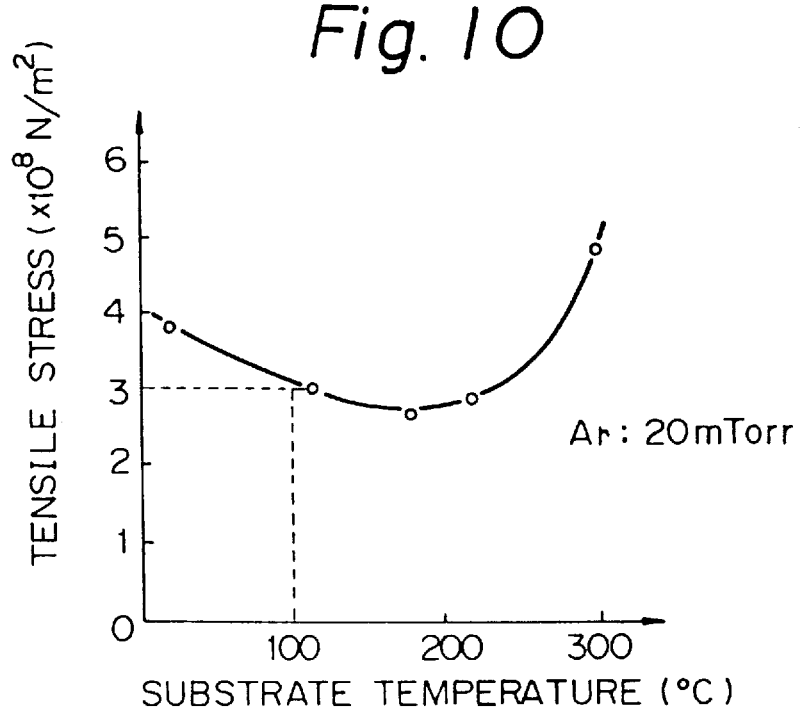
FIG. 10 shows the tensile strength of the nickel layer in relation to the temperature of the substrate.

FIG. 10 shows the relationships between the tensile stress of the Ni layer and the temperature of the substrate. The Ar gas pressure was 20 mTorr. It is seen from FIG. 9 that there is an optimum range of the substrate temperature for reducing the stress of the Ni layer, which optimum range is 100° to 250° C. At a temperature of the substrate below 100° C., the intrinsic stress of the Ni layer caused during the deposition becomes larger so that the tensile stress of the Ni layer is large as shown in FIG. 10. At a temperature of the substrate above 250° C., the thermal stress due to the difference of the thermal expansion coefficient between Si and Ni has an affect, so that the tensile stress of the Ni layer is again large as shown in FIG. 10.

Figure 11:
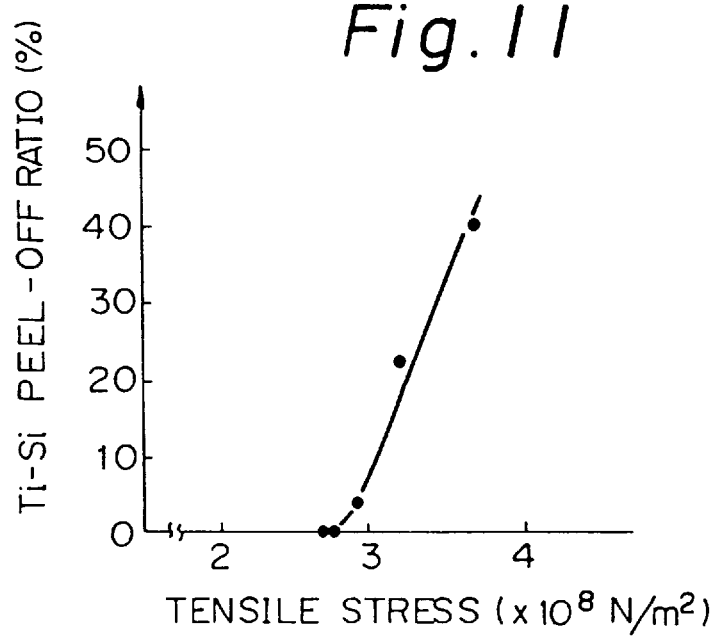
FIG. 11 shows the relationships between the rate of area of Ti—Si peel-off and the tensile strength of the nickel layer.
Figure 12:
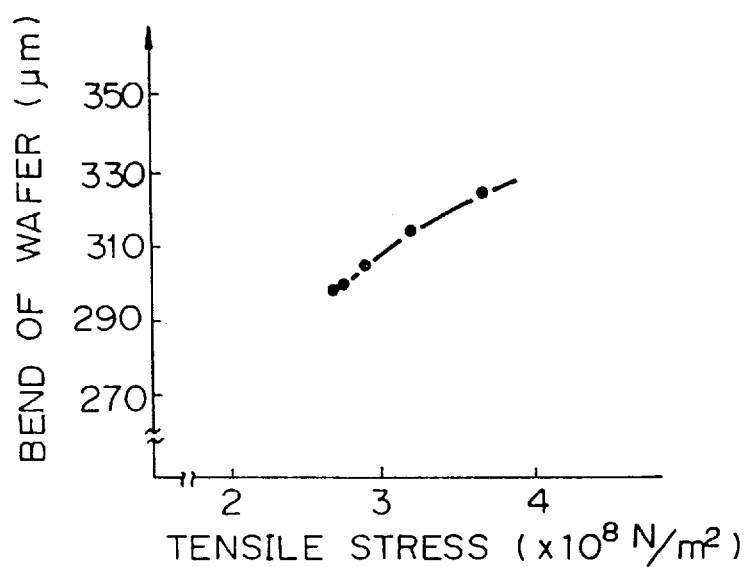
FIG. 12 shows the relationships between the bend of the wafer and the tensile strength of the nickel layer.

FIGS. 11 and 12 show the relationships of the tensile stress of the Ni layer with the Ti—Si peel-off rate and the bend of the wafer, respectively. It is seen from these FIGS. that, when the tensile stress of the Ni layer is above $3 \times 10^8$ N/m$^2$, the Ti—Si peel-off rate is rapidly increased and the bend of the wafer is increased beyond the desired limit. Therefore, the tensile stress is preferably not more than $3 \times 10^8$ N/m$^2$. From FIG. 6, it is seen that the tensile stress of not more than $3 \times 10^8$ N/m$^2$ can be obtained by increasing the Ar gas pressure to 12 mTorr or more. Also, it is seen from FIG. 10 that the tensile stress of not more than $3 \times 10^8$ N/m$^2$ can be obtained by adjusting the substrate temperature to 100°–250° C.

Although a Ti layer was used for an ohmic contact between the Ni layer and the Si substrate in the above Example, chlomium (Cr) or vanadium (V), etc. may be used instead of Ti, for the same purpose. The thickness of the Ti layer is not limited to 250 nm and may be 100–400 nm. The thickness of the Ni layer is not limited to 600 nm and may be 200–1000 nm.

As described above, according to the present invention, by increasing the Ar gas pressure during sputtering, the (111) plane of the Ni layer is decreased and the density, and therefore, the stress of the Ni layer are reduced, whereby the bend of the wafer is reduced and an automatic transfer of the wafer becomes possible. Further, in a conventional process, a heat treatment at 450° C. is carried out to improve the adhesive strength between Ti and Si and to prevent peel-off between the Ti and Si, which results in an enlarging of the bend of the wafer. Nevertheless, this heat treatment can be eliminated because the adhesive strength between the Ti and Si is improved by the reduction of stress of the Ni layer.

Although an Ar gas pressure of 20 mTorr was adopted in the above Example, the Ar gas pressure is not limited thereto and, by adopting an Ar gas pressure of not less than 12 mTorr as stated above, the tensile stress of the Ni layer can be made $3 \times 10^8$ N/m$^2$ or less and the Ti—Si peel-off rate and the bend of the wafer can be advantageously improved. As seen in FIG. 3 and 6, the characteristics of the Ni layer are abruptly changed at around an Ar gas pressure of 15 mTorr and saturated around 20 mTorr. Particularly, in FIG. 3 at an Ar gas pressure of 15 mTorr or more, the peak intensity ratio is over 10% and almost saturated, and therefore, an Ni layer having stable characteristics can be obtained regardless of slight variations of the Ar gas pressure.

Figure 13:
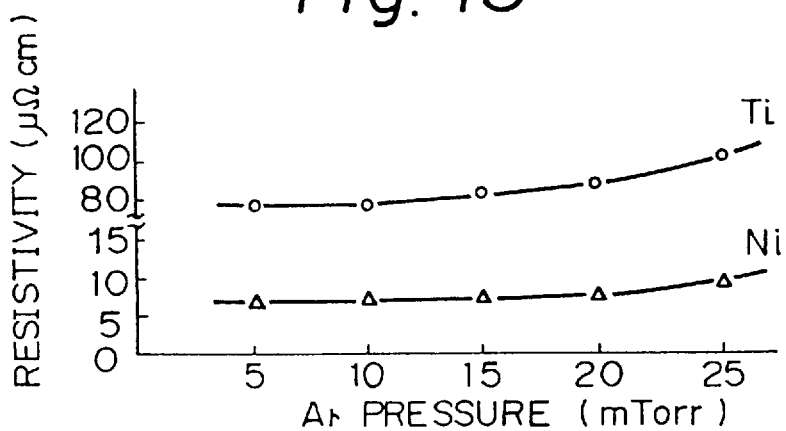
FIG. 13 shows the electric resistivity in relation to the argon pressure.

In the above, the lower limit of the Ar gas pressure is described and the upper limit of the Ar gas pressure is not particularly limited and may be determined by the limit of the sputtering unit.

Where a Ti layer, etc., as a barrier metal, is inserted between a Si substrate and an Ni layer, the upper limit of the Ar gas pressure is determined by the electric resistivity of the metal. FIG. 13 shows the electric resistivity of Ni and Ti layers in relation to the Ar gas pressure, in which Δ denotes the electric resistivity of the Ni layer and ○ denotes that of the Ti layer. Here, if the electric resistivity of the barrier metal is over 120 μΩ·cm, the ohmic contact between Si and Ti becomes nonuniform and the density of the Ti is decreased, whereby Si and Ni interdiffuse through the Ti layer and the adhesive strength is lowered. Therefore, the electric resistivity should be 120 μΩ·cm or less. Considering the dispersion of the electric resistivity of ±15 mΩ·cm when the Ar gas pressure is 25 mTorr, the upper limit of the Ar gas pressure should be 25 mTorr.

The present invention can provide a low stress metal layer on a substrate of various materials with a good adhesion. Particularly, it is useful for forming a rear electrode on a substrate of a power in which doped regions etc. are formed on the top surface thereof. Such a power element may be a DMOS and IGBT, etc.

The unit for sputtering may be not only a parallel plane type but also a cylinder type, etc.

We claim:

1. A nickel layer consistig of nickel and unavoidable impurities formed on a silicon substrate, in which a percent ratio of an X-ray diffraction peak intensity of Ni(200)/Ni (111) is not less than 10%.

2. A nickel layer according to claim 1, wherein a barrier metal layer is disposed between the nickel layer and the silicon substrate.

3. A nickel layer according to claim 2, wherein said barrier metal layer is Ti, V or Cr.

4. A nickel layer according to claim 3, wherein the nickel layer has a thickness of 200 to 1000 nm and the barrier metal layer has a thickness of 100 to 400 nm.

5. A nickel layer according to claim 3, wherein the nickel layer has a tensile stress of not more than $3 \times 10^8$ N/m$^2$.

6. A power element comprising:

a silicon substrate having a top surface and a rear surface;

a doped region formed adjacent to the top surface of the substrate;

a first electrode formed on the top surface of the substrate and electrically connected to the doped region; and a second electrode formed on the rear surface of the substrate, the second electrode including a nickel layer consisting of nickel and unavoidable impurities in which a percent ratio of an X-ray diffraction peak intensity of the Ni (200)/Ni (111) of the nickel layer is not less than 10%.

7. A power element according to claim 6, wherein a titanium layer is disposed between the nickel layer and the silicon substrate.

8. A power element according to claim 6, wherein the power element is a bipolar transistor.

9. A nickel layer consisting of nickel and unavoidable impurities formed on a silicon substrate with a barrier metal layer therebetween, said nickel layer formed by sputter at a temperature of the substrate of 100° to 250° C. and under an argon pressure of the 12 to 25 m Torr, wherein a percentage ratio of an X-ray diffraction peak intensity of Ni(200)/Ni (111) is not less than 10%.

10. A product according to claim 9 wherein the substrate is one of silicon and glass.

11. A nickel layer according to claim 9 wherein the barrier metal layer is Ti, V or Cr.

* * * * *

UNITED STATES PATENT AND TRADEMARK OFFICE
CERTIFICATE OF CORRECTION

PATENT NO.      : 5,876,861
DATED           : March 2, 1999
INVENTOR(S)     : KONDO et al.

It is certified that error appears in the above-identified patent and that said Letters Patent is hereby corrected as shown below:

Column 1, line 4, delete "now abandoned" change to --now pending--

Signed and Sealed this

Twenty-eighth Day of December, 1999

Attest:

Q. TODD DICKINSON

Attesting Officer        Acting Commissioner of Patents and Trademarks

UNITED STATES PATENT AND TRADEMARK OFFICE
CERTIFICATE OF CORRECTION

PATENT NO. : 5,876,861
DATED : March 2, 1999
INVENTOR(S) : KONDO et al.

It is certified that error appears in the above-identified patent and that said Letters Patent is hereby corrected as shown below:

On the title page,

Please correct the data as shown:

[62] delete "abandoned", first occurrence.

Signed and Sealed this

Fourteenth Day of March, 2000

Attest:

Q. TODD DICKINSON

Attesting Officer

Commissioner of Patents and Trademarks